(12) United States Patent
Watanabe et al.

(10) Patent No.: US 6,445,111 B2
(45) Date of Patent: Sep. 3, 2002

(54) LAMINATED PIEZOELECTRIC TRANSFORMER

(75) Inventors: Yoshiyuki Watanabe; Hiroshi Kishi; Yasuyuki Inomata; Shigeo Ishii; Mitsuya Tsujikawa, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/823,108

(22) Filed: Mar. 30, 2001

(30) Foreign Application Priority Data

Mar. 30, 2000 (JP) ........................................ 2000-095796

(51) Int. Cl.$^7$ .............................................. H01L 41/08
(52) U.S. Cl. ........................ 310/358; 310/359; 310/366
(58) Field of Search ........................ 310/328, 330–332, 310/366, 358, 359

(56) References Cited

U.S. PATENT DOCUMENTS

| | | | | | |
|---|---|---|---|---|---|
| 5,463,266 | A | * | 10/1995 | Fukuoka et al. | ............ 310/359 |
| 5,507,898 | A | * | 4/1996 | Aoki et al. | ............ 310/358 X |
| 5,751,092 | A | * | 5/1998 | Abe | ............ 310/359 |
| 6,008,565 | A | * | 12/1999 | Inoi et al. | ............ 310/366 |
| 6,037,706 | A | * | 3/2000 | Inoi et al. | ............ 310/366 |
| 6,288,479 | B1 | * | 9/2001 | Watanabe | ............ 310/359 |

* cited by examiner

Primary Examiner—Mark O. Budd
(74) Attorney, Agent, or Firm—Katten Muchin Zavis Rosenman

(57) ABSTRACT

A piezoelectric transformer includes an output part having laminated sheets formed of a first piezoelectric material and one or more input parts, each having laminated sheets made of a second piezoelectric material. The piezoelectric strain constant of the second piezoelectric material is greater than that of the first piezoelectric material.

12 Claims, 8 Drawing Sheets

LAMINATED PIEZOELECTRIC TRANSFORMER

FIELD OF THE INVENTION

The present invention relates to a piezoelectric transformer; and, more particularly, to a laminated piezoelectric transformer for use in a converter and an adaptor.

BACKGROUND OF THE INVENTION

Piezoelectric transformers feature smaller sizes and easily obtainable higher efficiencies than conventional electromagnetic transformers. For such reasons, piezoelectric transformers are gaining popularity as step-up transformers, e.g., backlight power sources of liquid crystal display (LCD) monitors. However, step-down transformers are more frequently used in power supplies than step-up transformers.

It is preferable that a piezoelectric transformer have such characteristics as high output power, less heat generation, small size and high efficiency. However, increasing the output power of a conventional piezoelectric transformer gives rise to the increased heat generation, which in turn reduces the output power thereof. The output power P of the piezoelectric transformer is represented as follows:

$$P \propto \frac{k^2}{1-k^2} \cdot V \cdot v^2$$

where k is an electromechanical coupling coefficient of a secondary part of the piezoelectric transformer, v is a propagation velocity of a mechanical vibration and V is the volume of the secondary part. If the temperature of the secondary part is increased due to the increased heat generation, the electromechanical coupling coefficient k of the secondary part decreases and the output power P also decreases accordingly.

SUMMARY OF THE INVENTION

It is, therefore, a primary object of the present invention to provide a piezoelectric transformer capable of generating a high output power by suppressing heat generation therefrom.

In accordance with a preferred embodiment of the present invention, there is provided a piezoelectric transformer including:

an output part having laminated sheets of a first piezoelectric material; and one or more input parts, each having laminated sheets of a second piezoelectric material, wherein a piezoelectric strain constant of the second piezoelectric material is greater than that of the first piezoelectric material.

In accordance with another preferred embodiment of the present invention, there is provided a piezoelectric transformer including:

a laminated body having an output part and one or more input parts; and external electrodes, wherein the output part includes sheets formed of a first piezoelectric material and first internal electrodes, each of the first internal electrodes being formed between every two neighboring sheets of the first piezoelectric material and the first internal electrodes being alternately exposed at first two substantially opposite sides of the laminated body and wherein each of the input parts includes sheets formed of a second piezoelectric material and second internal electrodes, each of the second internal electrodes is formed between every two neighboring sheets of the second piezoelectric material and the second internal electrodes are alternately exposed at second two substantially opposite sides of the laminated body, and wherein the external electrodes are separated from each other and formed on first and second side surfaces, and wherein a piezoelectric strain constant of the second piezoelectric material is greater than that of the first piezoelectric material.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
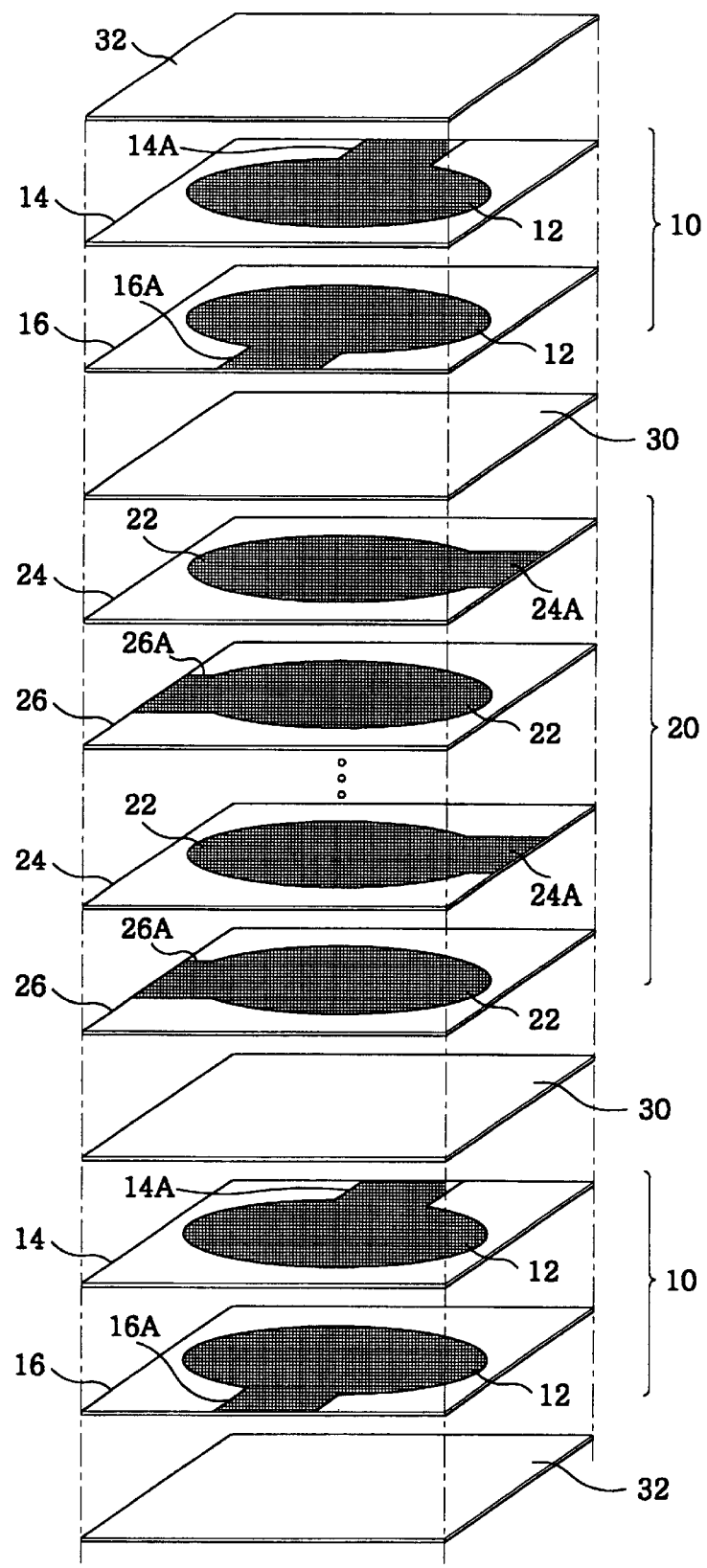
FIG. 1 shows a laminated structure of a piezoelectric transformer in accordance with a first preferred embodiment of the present invention.

An output power of a piezoelectric transformer is basically dictated by a mechanical vibration velocity thereof. Therefore, it is preferable that large strain material having a large piezoelectric strain constant be used as the piezoelectric material in order to obtain a high vibration velocity which gives rise to a high output power. In fact, however, the widely used piezoelectric material is the one having a large mechanical quality factor (Qm) capable of generating a large output power with a relatively small strain. The use of such piezoelectric material satisfies the requirements for obtaining a high output power with mild vibrations in the piezoelectric transformer.

Many conventional piezoelectric transformers, such as Rosen type piezoelectric transformers, operate using a longitudinal vibration mode. Therefore, it is difficult to form the input and output parts of a piezoelectric transformer by using different materials. In a piezoelectric transformer, however, an electrical signal is converted into a mechanical vibration at the input part thereof and a mechanical vibration is converted into an electrical signal at the output part thereof. Accordingly, it may be preferable to choose a soft piezoelectric material at the input part thereof since a soft piezoelectric material is more efficient to convert the electrical signal into the mechanical vibration than a hard piezoelectric material. At the output part thereof, it may be preferable to adopt a hard piezoelectric material since the hard piezoelectric hard material is more efficient in converting a mechanical vibration into an electrical signal than a soft piezoelectric material.

More specifically, since an electrical signal is converted into a mechanical vibration at the input part of the piezoelectric transformer, it is preferable to employ a material capable of generating a large strain with the application of a low voltage at the input part. Since a large strain material used in a piezoelectric actuator or a piezoelectric acoustic device has a large piezoelectric strain constant "d" and a small mechanical quality factor Qm, it is called a soft piezoelectric material and is preferably used for the input part of a piezoelectric transformer.

Since the output part of a piezoelectric transformer serves to generate an output power by converting a mechanical vibration into an electrical signal, it is preferable to use a material capable of generating a large electrical signal from a small input strain. A high output power generation material having a large mechanical quality factor Qm is preferably used for the output part.

Requirements for preferable piezoelectric materials for the input and the output parts of a transformer are summarized in Table 1 below.

TABLE 1

| | |
|---|---|
| Dielectric constant (ε) | Input part > Output part |
| Piezoelectric strain constant (d) | Input part > Output part |
| Mechanical quality factor (Qm) | Input part ≦ Output part |

As discussed above, in order to realize a piezoelectric transformer capable of generating a large output power, different material characteristics are required at the input and the output parts of a piezoelectric transformer. In accordance with the present invention, a high strain material and a high output power generation material are used at the input and the output parts of a piezoelectric transformer, respectively, thereby enhancing the vibration velocity thereof and increasing the output power thereof.

Referring to FIGS. 1 to 4, a first preferred embodiment of the present invention will now be described. FIG. 1 shows a laminated structure of a piezoelectric transformer in accordance with the first preferred embodiment having an output part (power generation part) 20 thereof located between two input parts 10 (vibrator part). At each of the lower and the upper input parts, a first sheet 14 and a second sheet 16 are laminated, each sheet having at substantially the center portion thereof an electrode 12 of, e.g., a circular shape. The number of sheets in each input portion 10 can be more than two. There is formed at the internal electrode 12 on the first sheet 14 a terminal portion 14A extended to a rear edge of the sheet 14. Also formed at the internal electrode 12 on the second sheet 16 is a terminal portion 16A extended to a front edge of the sheet 16. Namely, the internal electrodes 12 for each input part extend along the forward and backward directions by the terminal portions 16A and 14A, respectively.

At the output part 20, upper sheets 24 and lower sheets 26 are alternately laminated, wherein an internal electrode 22 having, e.g., a circular shape is formed around a center portion on each of the sheets 24 and 26. For example, six pairs of upper and lower sheets (i.e., twelve sheets in total) are laminated.

At the internal electrode 22 on each upper sheet 24, there is formed a terminal portion 24A extended to a right edge of the sheet 24. Also formed at the internal electrode 22 on the lower sheet 26 is a terminal portion 26A extended to a left edge of the sheet 26. That is, the internal electrodes 22 are extended along the right and the left directions by the terminal portions 24A and 26A, respectively.

Insulation sheets 30 for separating the input parts 10 from the output part 20 are disposed therebetween as shown in FIG. 1. Protection sheets 32 are provided on an uppermost sheet 14 and a lowermost sheet 16, respectively.

High strain piezoelectric (PZT), e.g., green sheets having a large dielectric constant "ε", a large piezoelectric strain constant "d" and a small mechanical quality factor Qm are used for the sheets 14 and 16 of the input parts 10. On the other hand, high output power piezoelectric, e.g., green sheets having a small dielectric constant "ε", a small piezoelectric strain constant "d" and a large mechanical quality factor Qm are used for the sheets 24 and 26 of the output part 20. An Ag or Pd alloy is used as the internal electrodes 12, 22 and terminal portions 14A, 16A, 24A and 26A.

Figure 2:
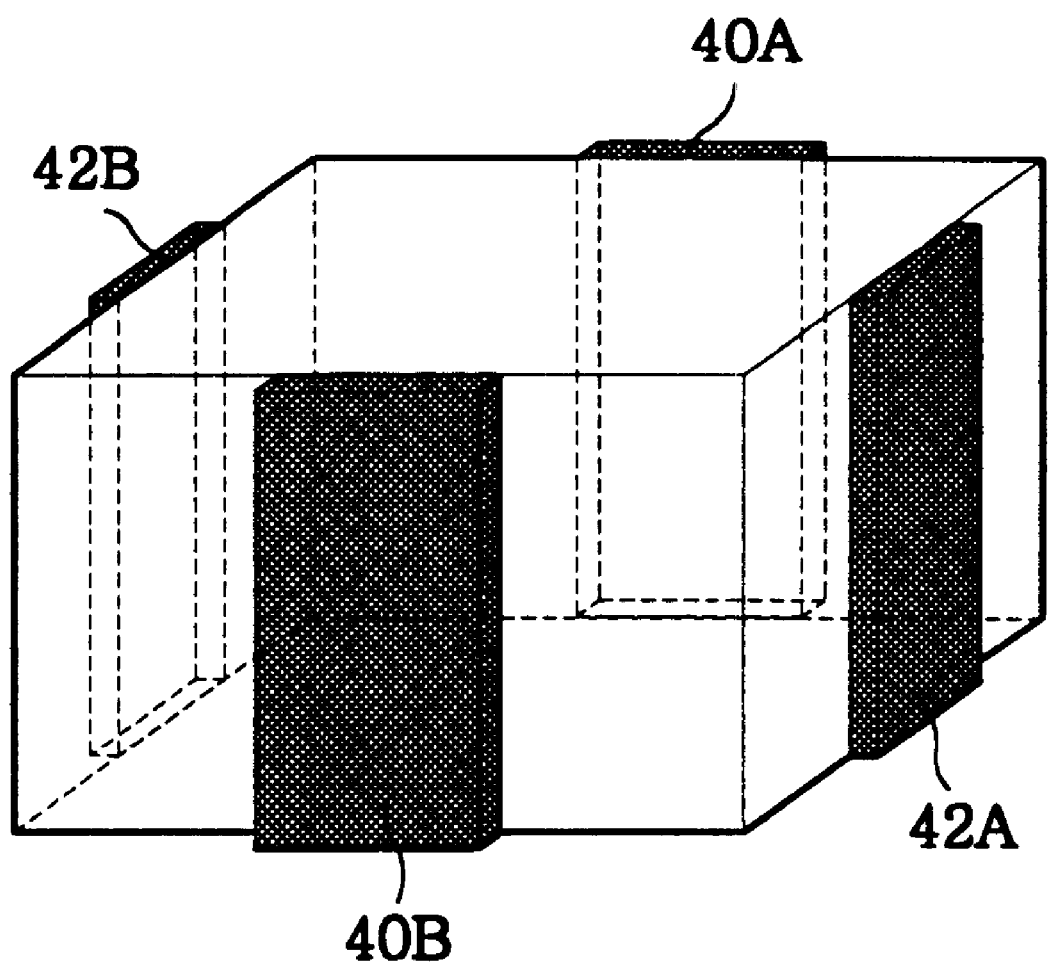
FIG. 2 offers a perspective view of the piezoelectric transformer in accordance with the first preferred embodiment of the present invention.

All the sheets constituting the piezoelectric transformer are compressed after being stacked as shown in FIG. 1. Thereafter, a binder removing and a sintering processes are performed and then external electrodes are formed on the sintered body as shown in FIG. 2. In this embodiment, the terminal portions 14A of the input parts 10 are connected to an external electrode 40A and the terminal portions 16A thereof are connected to an external electrode 40B as illustrated in FIG. 2. The terminal portions 24A of the output part 20 are connected to an external electrode 42A and the terminal portions 26A thereof are connected to an external electrode 42B.

The external electrodes 40A, 40B, 42A and 42B are formed of a conductive material, e.g., Ag. Next, a poling of the sintered body is performed through the use of external electrodes formed thereon. For instance, the poling of the sintered body is achieved by applying an electric field of 2 kV/mm between the external electrodes 40A and 40B and between 42A and 42B at 100° C. for 10 min. As a result, a piezoelectric transformer 44 is obtained.

Figure 3A:
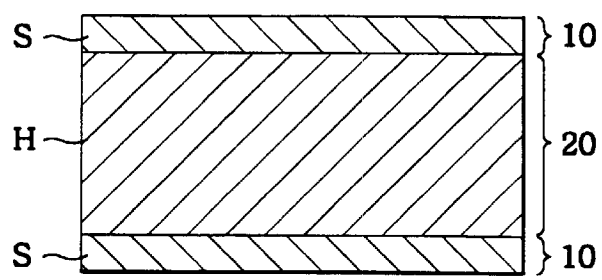
FIGS. 3A–3C depict laminated structures of the piezoelectric transformer of the present invention and exemplary conventional piezoelectric transformers.
Figure 3B:
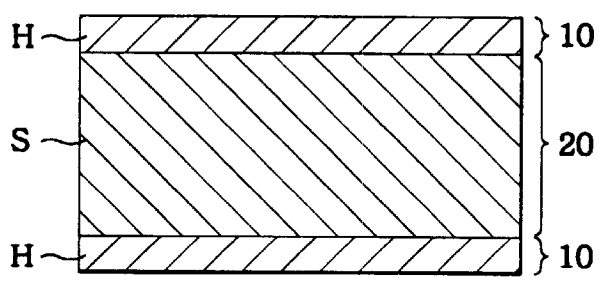
Figure 3C:
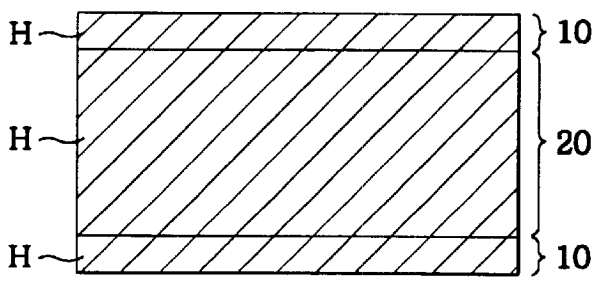

Thereafter, the piezoelectric transformer 44 so obtained is compared with conventional piezoelectric transformers. FIGS. 3A–3C depict laminated structures of the piezoelectric transformer of the present invention and two prior art transformers. FIG. 3A depicts a laminated structure of the piezoelectric transformer of the present invention, wherein the high strain material (S) is used at the input parts 10 thereof and the high output power generation material (H) is used at the output part 20. FIG. 3B illustrates a laminated structure of a first comparative sample, wherein a high strain material (S) is used as the output part 20 where a high output power generation material (H) is used for the input parts 10 thereof. FIG. 3C presents a laminated structure of a second comparative sample, wherein a high output power generation material (H) is used both at the output part 20 and the input parts 10 thereof.

Figure 4:
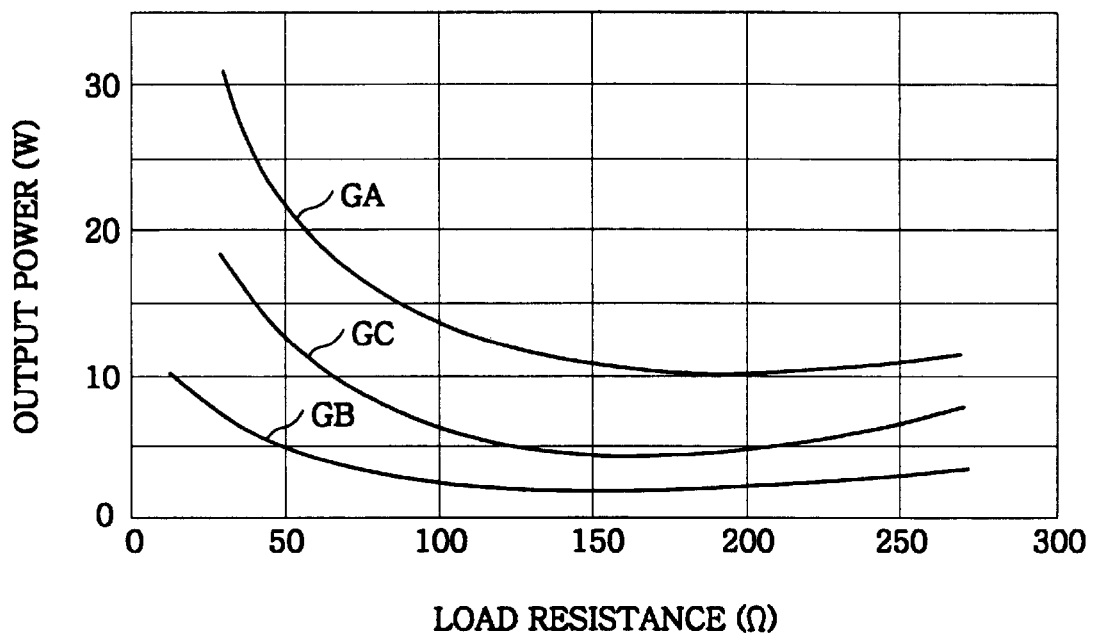
FIG. 4 provides a graph expressing the dependency of output powers on corresponding load resistances for the piezoelectric transformer of the present invention and exemplary conventional piezoelectric transformers.

Referring to FIG. 4, there are illustrated test results of the piezoelectric transformers shown in FIGS. 3A–3C, showing output powers as a function of load resistance. In FIG. 4, a horizontal axis and a vertical axis represent a load resistance (Ω) and an output power (W), respectively. Graphs GA, GB and GC of FIG. 4 correspond to the samples of FIGS. 3A to 3C, respectively. As is apparent from FIG. 4, the piezoelectric transformer of the present invention generates a higher output power than the first and the second comparative samples.

Since the material constituting the input parts has a higher piezoelectric strain constant (d) than that for the output part in accordance with the invention as described above, an efficient mechanical vibration can be obtained at the input parts and the mechanical vibration is efficiently converted into a corresponding electric signal at the output part. Accordingly, a piezoelectric transformer having less power loss, which gives rise to less heat generation and greater output power, can be obtained.

Figure 5:
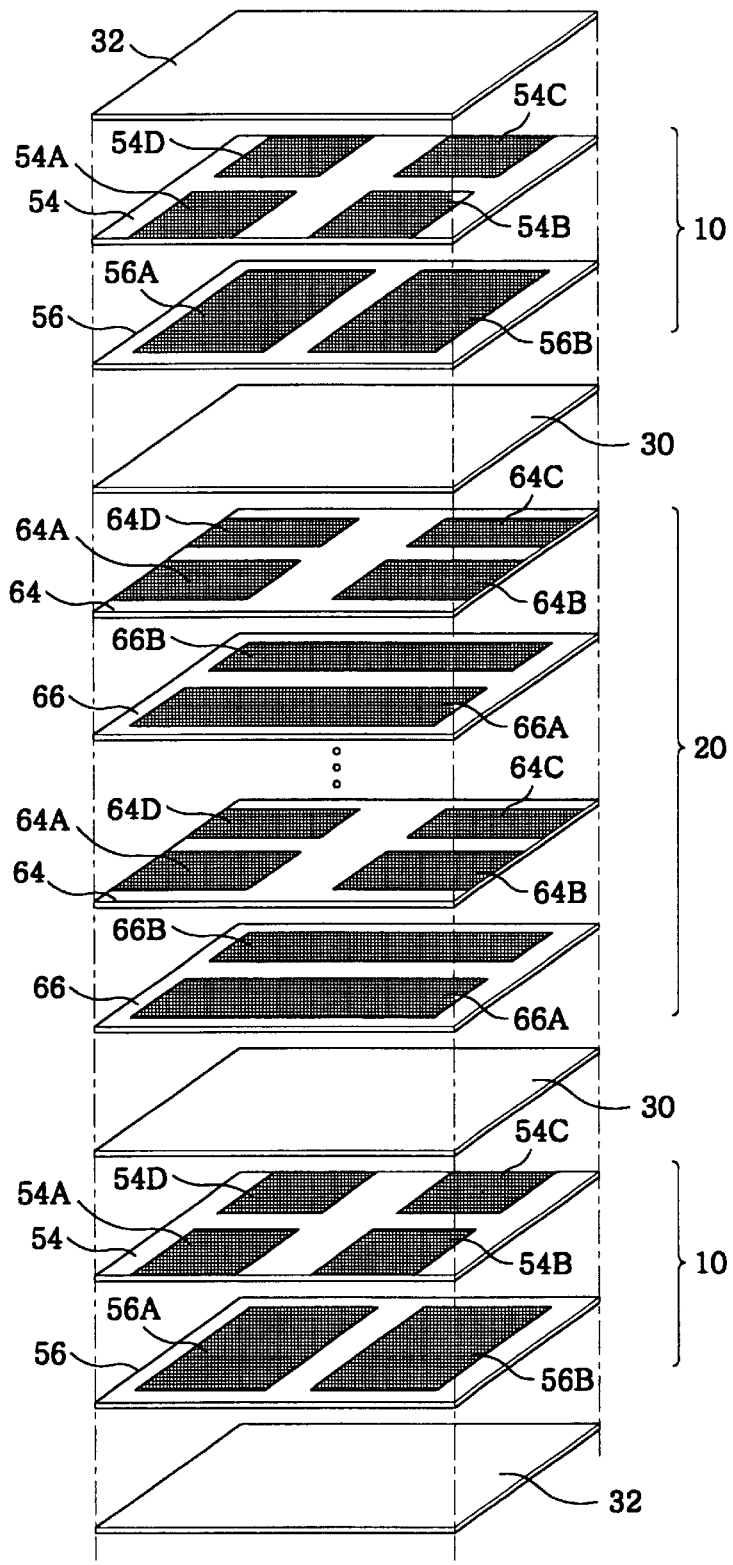
FIG. 5 presents a laminated structure of a piezoelectric transformer in accordance with a second preferred embodiment of the present invention.
Figure 6A:
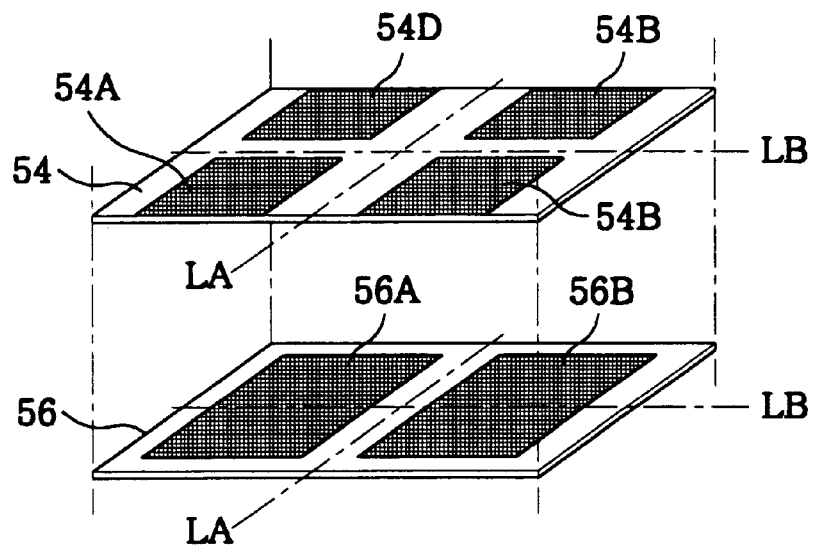
FIGS. 6A and 6B illustrate cut configurations of the piezoelectric transformer in accordance with the second preferred embodiment of the present invention.
Figure 6B:
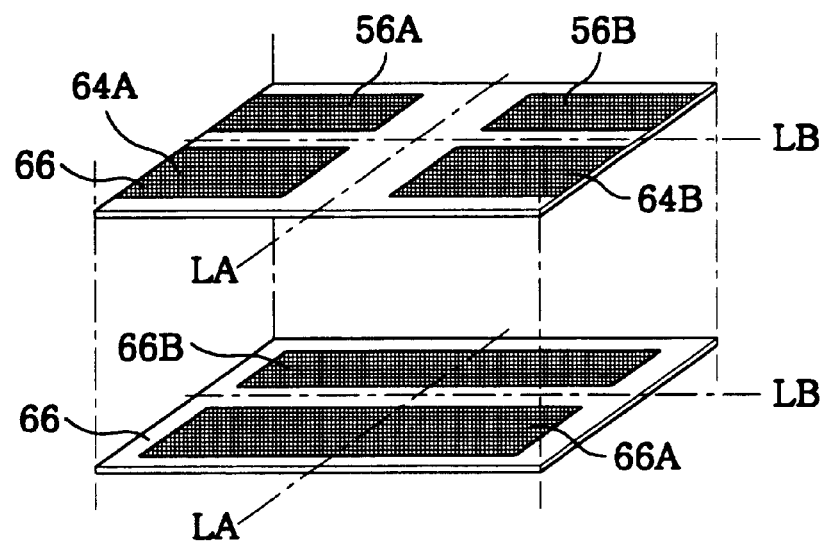

Referring to FIGS. 5 to 6B, a second preferred embodiment of the present invention will now be described. Like reference numerals used in the first and the second preferred embodiments represent like parts. FIG. 5 presents a laminated structure of a piezoelectric transformer in accordance with the second preferred embodiment of the present invention.

As shown in FIG. 5, disjointed internal electrodes 54A to 54D, each having, e.g., a rectangular shape, are formed on a sheet 54 in each input part 10, wherein the electrodes 54A and 54B are exposed at a front edge of the sheet 54 and the electrodes 54C and 54D are exposed at a rear edge of the sheet 54. On a sheet 56 of each of the input parts 10, there is formed an internal electrode 56A such that the internal electrode 56A overlaps with portions of the internal electrodes 54A and 54D when viewed from top. Further, a rectangular internal electrode 56B is also formed on the sheet 56 such that the internal electrode 56B overlaps with portions of the internal electrodes 54B and 54C when viewed from the top. The internal electrodes 56A and 56B are separated from each other and are not exposed at any edges of the sheet 56.

Meanwhile, rectangular-shaped internal electrodes 64A to 64D are formed separately on every sheet 64 of the output part 20 such that two electrodes 64B and 64C are exposed at a right edge of the sheet 64 and the remaining electrodes 64A and 64D are exposed at a left edge of the sheet 64. Further, a rectangular-shaped internal electrode 66A is formed on every sheet 66 of the output part 20 such that the internal electrode 66A overlaps with the internal electrodes 64A and 64B when viewed from top. A rectangular-shaped internal electrode 66B is also formed on every sheet 66 such that the internal electrode 66B overlaps with the internal electrodes 64C and 64D. The internal electrodes 66A and 66B are separated from each other and are not exposed at the edges of the sheet 66.

Insulation sheets 30 for separating the input parts 10 from the output part 20 are laminated therebetween as shown in FIG. 5. Protection sheets 32 are also laminated at top and bottom of the laminated structure.

As in the first preferred embodiment of the invention, PZT green sheets having a large dielectric constant "$\epsilon$", a large piezoelectric strain constant "d" and a small mechanical quality factor Qm are used for the sheets 54 and 56 of the input parts 10. Meanwhile, PZT green sheets having a small piezoelectric strain constant "d", a small dielectric constant "$\epsilon$" and a large mechanical quality factor Qm are used for the sheets 64 and 66 of the output part 20 as in the first embodiment.

All the sheets constituting the laminated structure are compressed after being stacked and diced into four parts along the lines LA and LB as illustrated in FIGS. 6A and 6B. Since the input parts 10 are diced along lines LA and LB as shown in FIG. 6A, the internal electrodes 56A and 56B are exposed at diced edges thereof. Further, since the output part 20 is diced along the lines LA and LB as shown in FIG. 6B, the internal electrodes 66A and 66B are exposed at the diced edges thereof. After dicing, a binder removing process and a sintering process are performed on the diced laminated structure and then external electrodes are formed thereon in a similar fashion as illustrated in FIG. 2.

The piezoelectric transformers obtained by the first and the second preferred embodiments are identical each other excepting the shapes of the internal electrodes.

Figure 7A:
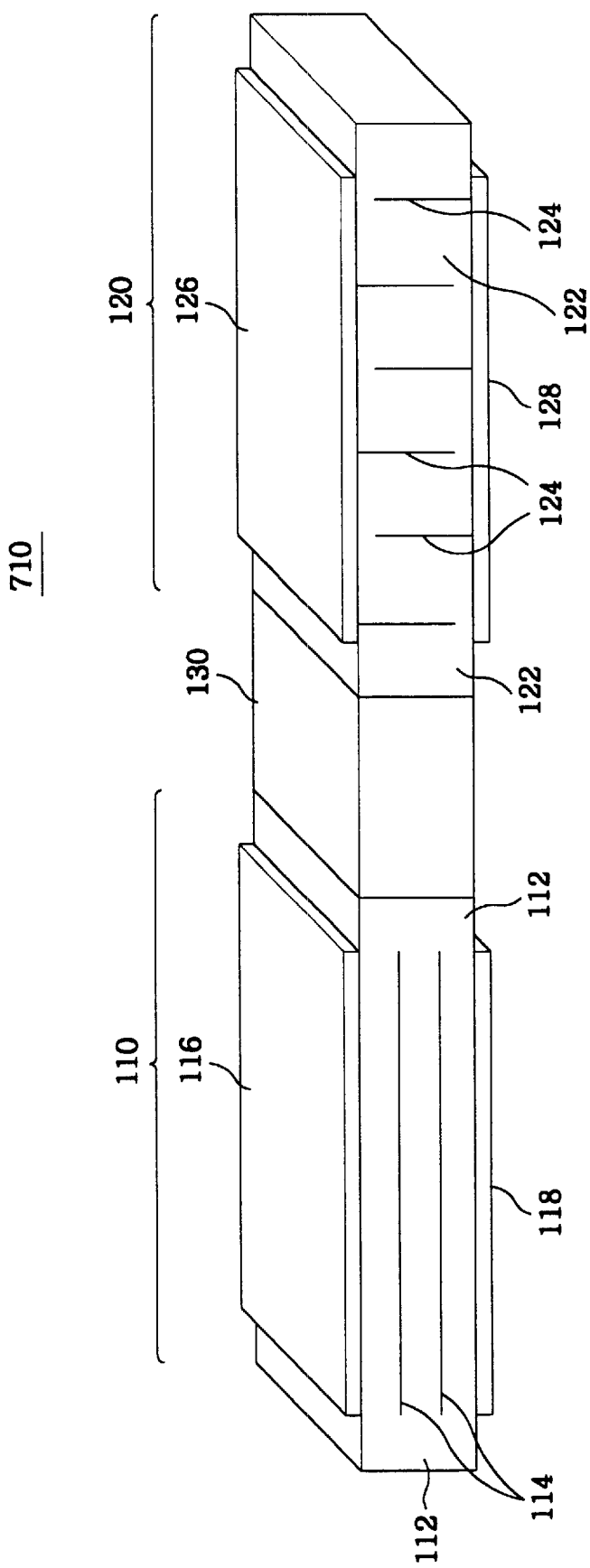
FIGS. 7A and 7B represent schematic diagrams of a piezoelectric transformer in accordance with a third preferred embodiment of the present invention.
Figure 7B:
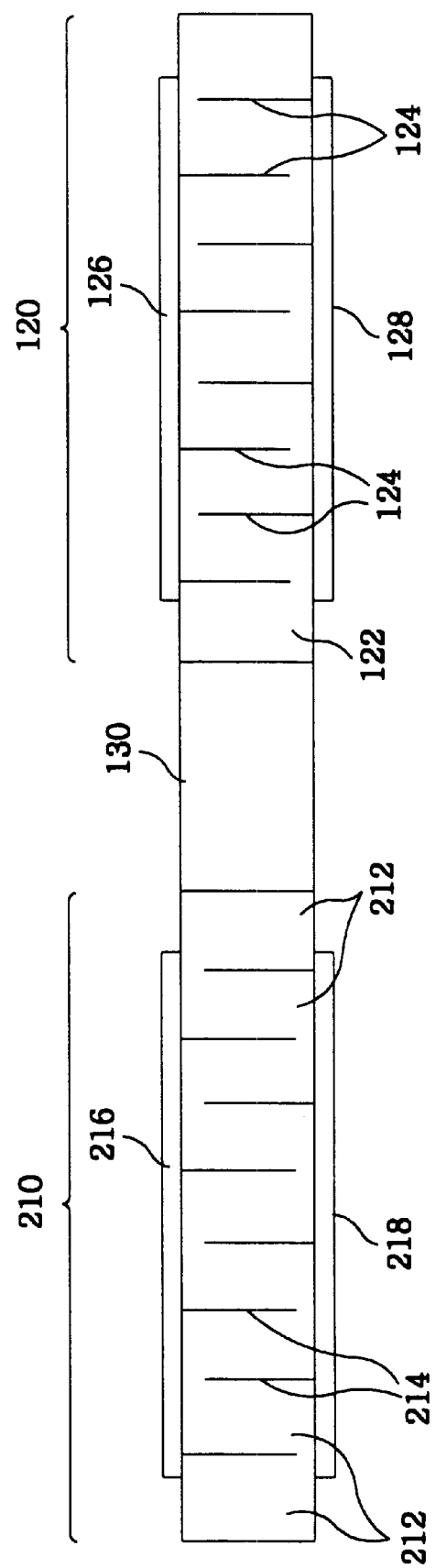

Referring FIGS. 7A and 7B, there are presented laminated structures of piezoelectric transformers 710 and 720 in accordance with a third preferred embodiment of the present invention. As shown in FIG. 7A, an input part 110 of the piezoelectric transformer 710 has internal electrodes 114 which are vertically laminated in a piezoelectric member 112. The internal electrodes 114 are alternately connected to an upper external electrode 116 and a lower external electrode 118.

Meanwhile, an output part 120 of the piezoelectric transformer 710 has internal electrodes 124 which are horizontally laminated in a piezoelectric member 122. The internal electrodes 124 are alternately connected to an upper external electrode 126 and a lower external electrode 128. The external electrodes may be formed on front and rear surfaces of the piezoelectric members. The input part 110 and the output part 120 are coupled by an insulating binder member 130.

A material having a large piezoelectric strain constant "d", a large dielectric constant "$\epsilon$" and a small mechanical quality factor Qm is used for the piezoelectric member 112 of the input part 110; and a material having a small piezoelectric strain constant "d", a small dielectric constant "$\epsilon$" and a large mechanical quality factor Qm is used for the piezoelectric member 122 of the output part 120 as in the first and second preferred embodiments of the present invention.

In the third preferred embodiment of the present invention, the input part 110 may be formed to have a structure of horizontally laminated internal electrodes and the output part 120 may be constructed to have vertically laminated internal electrodes.

In FIG. 7B, an input part 210 of the piezoelectric transformer 720 has internal electrodes 214 horizontally laminated in a piezoelectric member 212. The internal electrodes 214 are alternately connected to an upper external electrode 216 and a lower external electrode 218. The output part 120 and the insulating binder member 130 of the transformer 720 are identical to those of the transformer 710.

The piezoelectric transformer 720 shown in FIG. 7B can be considered as a variation of the piezoelectric transformers of the first and second preferred embodiments of the present invention. It is to be appreciated that shapes of the piezoelectric sheets or the electrodes, locations of external electrodes and the number of piezoelectric sheets may be varied appropriately if necessary. Further, various known materials may be used as the piezoelectric or the electrode material.

The present invention may be preferably employed in fabricating step-down piezoelectric transformers in order to obtain a large output power. However, the present invention may also be applied in fabricating step-up piezoelectric transformers as well. A step-up piezoelectric transformer can be obtained by decreasing the impedance of an input part and increasing the impedance of an output part. Conversely, a step-down piezoelectric transformer can be obtained by increasing the impedance of an input part and decreasing the impedance of an output part. This can be achieved by changing the laminated structure of the piezoelectric transformer.

As described above, a high strain material and a high output power generation material are used as the input part and the output part of the piezoelectric transformer of the present invention, respectively. Accordingly, efficient mechanical vibration can be achieved at the input part thereof and at the output part thereof, the mechanical vibration can be efficiently converted into an electrical signal, thereby obtaining a piezoelectric transformer having reduced heat generation and increased output power generation characteristics.

While the present invention has been described with respect to certain preferred embodiments only, other modifications and variations may be made without departing from the sprit and scope of the present invention as set forth in the following claims.

What is claimed is:

1. A piezoelectric transformer comprising:

an output part having laminated sheets of a first piezoelectric material; and one or more input parts, each having laminated sheets of a second piezoelectric material, wherein a piezoelectric strain constant of the second piezoelectric material is greater than that of the first piezoelectric material to enhance an output power thereof.

2. The piezoelectric transformer according to claim 1, wherein the piezoelectric transformer is of a step-down type having an input voltage greater than an output voltage.

3. The piezoelectric transformer according to claim 1, wherein the piezoelectric transformer has two input parts, the output part being disposed between the two input parts.

4. A piezoelectric transformer comprising:

a laminated body having an output part and one or more input parts; and external electrodes, wherein the output part includes sheets formed of a first piezoelectric material and first internal electrodes, each of the first internal electrodes being formed between every two neighboring sheets of the first piezoelectric material and the first internal electrodes being alternatively exposed at first two substantially opposite sides of the laminated body and wherein each of the input parts includes sheets formed of a second piezoelectric material and second internal electrodes, each of the second internal electrodes is formed between every two neighboring sheets of the second piezoelectric material and the second internal electrodes are alternately exposed at second two substantially opposite sides of the laminated body, and wherein the external electrodes are separated from each other and formed on first and second side surfaces, and wherein a piezoelectric strain constant of the second piezoelectric material is greater than that of the first piezoelectric material to enhance an output power thereof.

5. The piezoelectric transformer according to claim 4, wherein the piezoelectric transformer is of a step-down type having an input voltage greater than an output voltage.

6. The piezoelectric transformer according to claim 4, wherein the laminated body has two input parts, the output part being disposed between the two input parts.

7. The piezoelectric transformer according to claim 1, wherein a dielectric constant of the second piezoelectric material is greater than that of the first piezoelectric material.

8. The piezoelectric transformer according to claim 1, wherein a mechanical quality factor of the second piezoelectric material is equal to or less than that of the first piezoelectric material.

9. The piezoelectric transformer according to claim 1, wherein an insulation sheet is laminated between the output part and an input part.

10. The piezoelectric transformer according to claim 4, wherein a dielectric constant of the second piezoelectric material is greater than that of the first piezoelectric material.

11. The piezoelectric transformer according to claim 4, wherein a mechanical quality factor of the second piezoelectric material is equal to or less than that of the first piezoelectric material.

12. The piezoelectric transformer according to claim 4, wherein an insulation sheet is laminated between the output part and an input part.

* * * * *